(12) United States Patent
Aichi et al.

(10) Patent No.: US 7,283,199 B2
(45) Date of Patent: Oct. 16, 2007

(54) EXPOSURE APPARATUS, AND DEVICE MANUFACTURING METHOD

(75) Inventors: Shintaro Aichi, Utsunomiya (JP); Makoto Nomoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 147 days.

(21) Appl. No.: 11/226,339

(22) Filed: Sep. 15, 2005

(65) Prior Publication Data

US 2006/0061745 A1 Mar. 23, 2006

(30) Foreign Application Priority Data

Sep. 17, 2004 (JP) .............................. 2004/271727

(51) Int. Cl.
*G03B 27/52* (2006.01)
*G03B 27/42* (2006.01)

(52) U.S. Cl. .......................................... 355/30; 355/53
(58) Field of Classification Search ................. 355/30, 355/53, 77
See application file for complete search history.

(56) References Cited

U.S. PATENT DOCUMENTS 5,892,572 A * 4/1999 Nishi ........................... 355/67
6,633,364 B2 * 10/2003 Hayashi ...................... 355/53
6,987,554 B2 1/2006 Nomoto ...................... 355/53
2001/0055326 A1 * 12/2001 Miwa et al. .................. 372/57
2002/0024645 A1 * 2/2002 Nakano ....................... 355/53
2005/0110968 A1 5/2005 Aichi et al. .................. 355/30
2006/0176455 A1 8/2006 Nomoto ...................... 355/53

FOREIGN PATENT DOCUMENTS

JP 2002-324750 11/2002

* cited by examiner

*Primary Examiner*—Alan Mathews
(74) *Attorney, Agent, or Firm*—Fitzpatrick, Cella, Harper & Scinto

(57) ABSTRACT

An apparatus for exposing a wafer with light. The apparatus includes a chamber for enclosing at least a portion of a path of the light, a circulation system having a fan unit, an inactive gas supplying path from the fan unit to the chamber, and an inactive gas return unit from the chamber to the fan unit, in which the circulation system is arranged to circulate an inactive gas through the chamber, and a control unit for controlling the fan unit. The control unit changes a revolution speed of the fan unit so that the gas pressure inside the chamber is held within a tolerance. A pressure loss at the return path is smaller than a positive pressure being set with respect to a gas pressure inside the chamber.

5 Claims, 6 Drawing Sheets

EXPOSURE APPARATUS, AND DEVICE MANUFACTURING METHOD

FIELD OF THE INVENTION AND RELATED ART

This invention relates generally to an exposure apparatus having a chamber with a structure adapted to purge the inside space of the chamber.

With the further miniaturization of exposure patterns, the wavelength of light sources used in exposure apparatuses for the manufacture of semiconductor devices has been shortened more and more. That is, the exposure light sources have been changed from i-line light sources to excimer laser light sources and, regarding the laser light sources themselves, they have been changed from KrF laser light sources to ArF laser light sources. Currently, to satisfy the requirements for yet further miniaturization, the use of $F_2$ laser light sources is being contemplated.

In order to construct an exposure system that uses an $F_2$ laser as a light source, it is necessary to take measures for attenuation of exposure light energy. Since the energy of $F_2$ laser light is absorbed by moisture, oxygen, organic gases, etc., contained in the atmosphere, conventional exposure apparatuses cannot be used as they are.

An example of taking measures to an $F_2$ laser may be enclosing the entire space through which the exposure light passes, by use of a partition wall, and the space is then filled with an inactive gas or an inert gas, such as nitrogen, for example. However, in regions where a wafer and a reticle are to be placed, there occurs a large amount of heat generation by stage linear motors, or the like. Hence, a temperature-controlled inactive gas circulation system would be necessary to remove temperature fluctuation inside the space, to thereby maintain the stage positional precision.

FIG. 7 illustrates a general structure of a known type of an inactive gas circulation system. Chambers 3 enclose a wafer space 1 and a reticle space 2, respectively, inside the major assembly of an exposure apparatus. The inside space of each chamber 3 is gas-tightly closed. Each space (chamber) is provided with a temperature-controlled gas blow-out port 4 and a gas collecting port 5.

A circulating system 6 is provided to circulate an inactive gas through the chambers 3, the circulating gas being temperature controlled and contaminants removed. The circulating system 6 is connected to the blow-out port 4 and the gas collecting port 5 of each chamber 3 through a gas supply duct 7 and a gas return duct 8. The circulating system 6 comprises a cooling device 9, a blower 10, a filter 11, and a heater 12, which are provided in this order along the inactive gas flow direction, as internal equipment.

The inactive gas collected from the wafer space 1 or the reticle space 2 through the return duct 8 has absorbed therein the internally generated heat of the wafer space 1 or the reticle space 2, and hence, the heat is then exchanged by a cooling medium in the cooling device 9. The thus cooled inactive gas is then fed to the filter 11 whereby any contaminants therein are removed. The filter 11 may comprise a chemical filter, an activated carbon filter or an ULPA filter, for example. The chemical filter may remove ammonia, or the like, having a large photoresist reactivity. The activated carbon filter may remove siloxane or any other organic gases, which might degrade optical elements. The ULPA filter may remove particles. The cooled and contaminants removed inactive gas is then heated and temperature controlled by the heater 12, and it is fed to the temperature controlled gas blow-out port 4. Here, the blower 10 serves as a power source of fluid transportation for the circulation.

In addition to this, a high-purity inactive gas (or inert gas) is injected into each of the wafer space 1 and the reticle space 2 from an inactive gas injection valve 13. This is to maintain the inactive gas concentration inside the wafer space 1 and the reticle space 2. Furthermore, there are discharging valves 14 each of which serves to discharge a predetermined amount of gas outwardly through a throttle valve 15. With this structure, a positive pressure is created and maintained inside the wafer space 1 and the reticle space 2, such that entry of the atmospheric gas is prevented.

A temperature sensor 16 detects the temperature of the inactive gas, and a corresponding signal is applied to a temperature controller 17. The temperature controller 17 performs the temperature control of the inactive gas by adjusting the output of the heater 12 on the basis of PID feedback control.

Conventional inactive gas circulation systems comprise an even pressure-loss system wherein the pressure loss at the gas supply side (from a blower to a gas-tight chamber) and the pressure loss at the gas suction side (from the chamber to the blower) are approximately even. However, if the magnitude of the pressure loss at the gas suction side, from the chamber to the blower, is larger than the chamber set pressure, the area around the gas suction port of the blower has a negative pressure with reference to the outside of the gas-tight chamber, and it leads to a possibility of entry of outside gas or contaminants from such a negative pressure area.

On the other hand, in a circulation system in which the pressure loss at the gas supply side (from a blower to a gas-tight chamber) and the pressure loss at the gas suction side (from the chamber to the blower) are different from each other, at a start and a stop of the circulation blower, the internal pressure of the gas-tight chamber transitionally changes by a large amount. This leads to a possibility that the internal pressure goes out of the range between upper and lower limit pressures having been predetermined with reference to a projection lens, or the like, and also, that it adversely affects any instruments, such as a lens, which are very sensitive to the pressure.

SUMMARY OF THE INVENTION

It is accordingly an object of the present invention to provide an improved exposure apparatus by which at least one of the inconveniences described above can be removed or reduced.

In accordance with an aspect of the present invention, there is provided an apparatus for exposing a wafer with light, the apparatus comprising a chamber for enclosing at least a portion of a path of the light, and a circulation system having a fan unit, an inactive gas supplying path from the fan unit to the chamber, and an inactive gas return unit from the chamber to the fan unit, the circulation system being arranged to circulate an inactive gas through the chamber, wherein a pressure loss at the return path is less than a positive pressure being set with respect to a gas pressure inside the chamber.

In accordance with another aspect of the present invention, there is provided a device manufacturing method, comprising steps of exposing a substrate with light by use of an apparatus as discussed above, developing the exposed substrate, and processing the developed substrate to produce a device.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

First Embodiment

Figure 1:
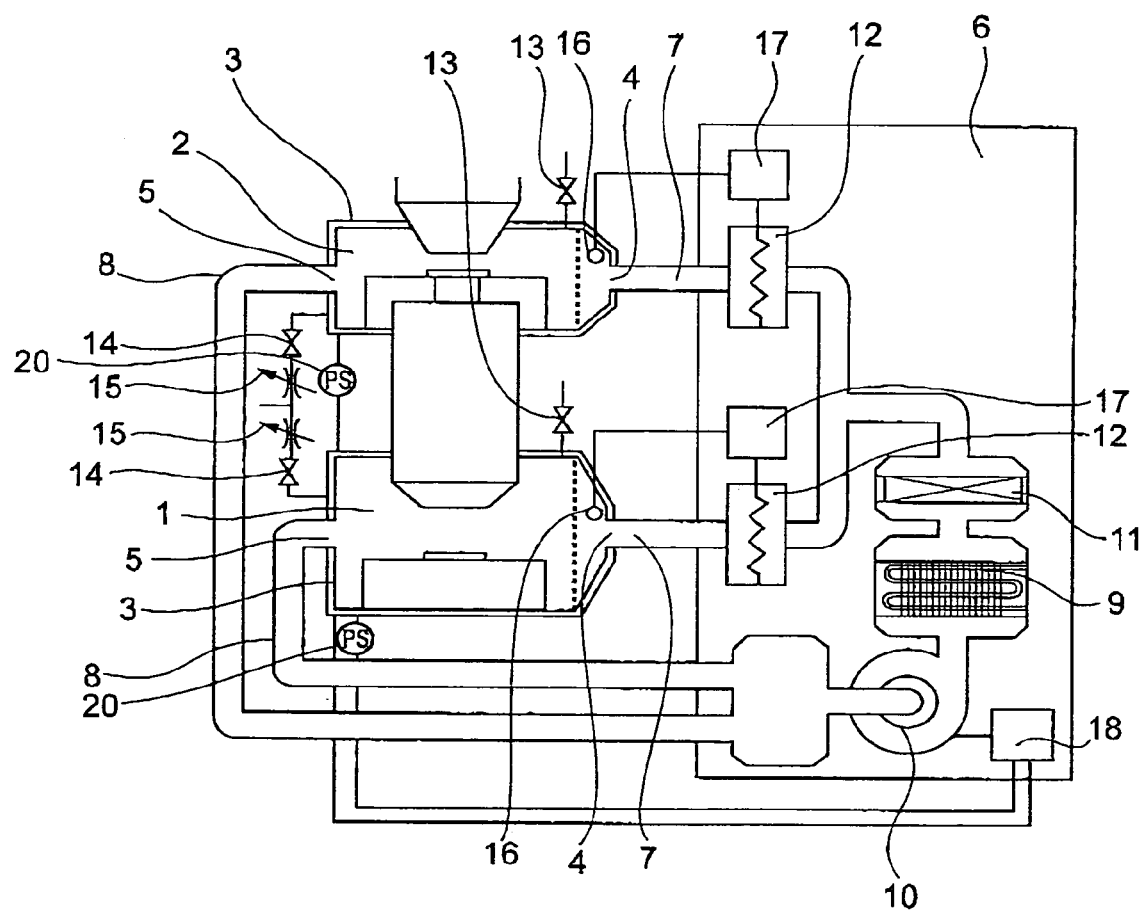
FIG. 1 is a schematic view of a general structure of an inactive gas circulation system of an exposure apparatus, according to a first embodiment of the present invention.

FIG. 1 is a schematic view of an exposure apparatus according to a first embodiment of the present invention. Basically, the exposure apparatus shown in FIG. 1 differs from the example shown in FIG. 7 in that the position of the cooling device 9 is changed and that a revolution speed (rotational frequency) gradient controlling mechanism 18 is newly added.

More particularly, the exposure apparatus of FIG. 1 has a circulation system which is arranged so that the pressure loss at the gas suction side from a chamber to a blower (fan unit) is made small as compared with a set internal pressure of the chamber. Specifically, a cooling device, which provides a pressure loss, is disposed in the gas supply side from the blower to the gas-tight chamber to ensure that a positive pressure is held even at the blower suction pressure, which becomes lowest inside the circulation system. By maintaining a positive pressure in the circulation system as such, entry of an atmospheric gas or of particles can be prevented or reduced.

In a circulation system in which the pressure at the gas supply side from the blower to the chamber and the pressure loss at the gas suction side from the chamber to the blower are even, no pressure fluctuation is produced inside the chamber at the start and stop of the blower operation.

In the circulation system of this embodiment, however, in order to maintain a positive pressure throughout the entire circulation system, the pressure loss at the gas suction side from the chamber to the blower is made small as compared with the set internal pressure of the chamber. Thus, it is a pressure-loss unbalanced circulation system. In such a case, since the head of the blower changes at the time of a start and stop of the blower, a transitional pressure fluctuation may be produced and such a pressure fluctuation may adversely affect instruments, such as a lens, which are very sensitive to the pressure.

Since, however, the circulation system is not a completely closed system, internal pressure fluctuation of a certain degree can be suppressed in a certain time period. Thus, by utilizing this, it is possible to suppress the transitional pressure fluctuation as described above within a tolerance (withstanding pressure range) of the instruments.

Figure 2:
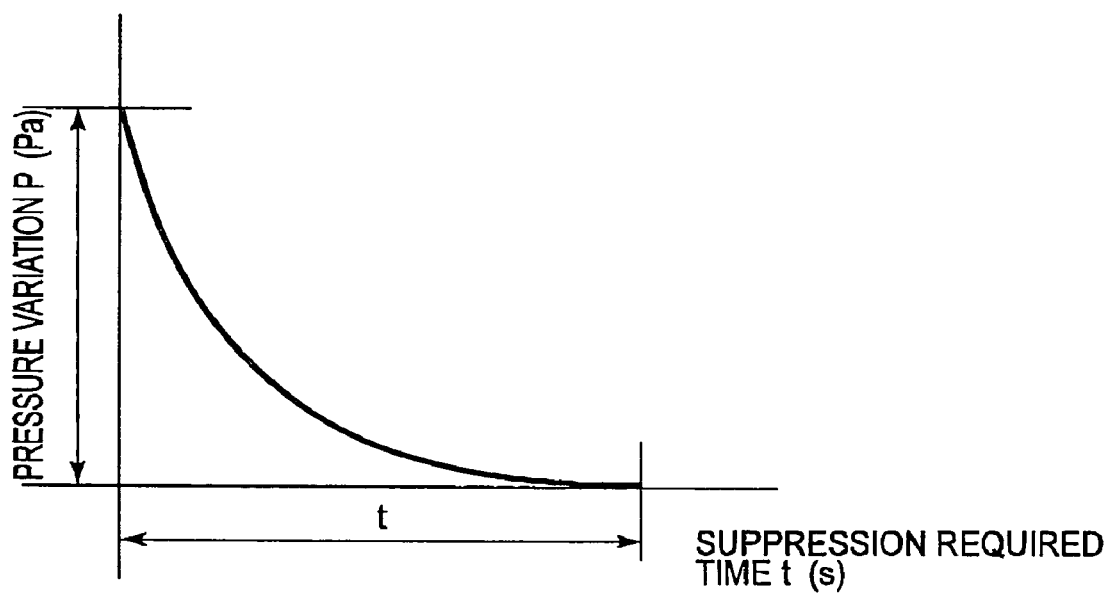
FIG. 2 is a graph for explaining the relation between the pressure fluctuation and the suppression required time, in the circulation system of FIG. 1.

Now, the mechanism of production of an internal pressure fluctuation and the mechanism for suppressing such an internal pressure fluctuation will be explained, with reference to an example wherein the revolution speed (rotational frequency) of the blower is raised. Since this circulation system is not a completely closed system, internal pressure fluctuation of a certain degree can be suppressed in a certain time period. FIG. 2 illustrates this. Here, when a certain internal pressure fluctuation $\Delta P$ is produced, the time necessary for suppressing such an internal pressure fluctuation is denoted by t. The time constant for suppression of such an internal pressure fluctuation is determined by the capacity of the circulation system, the exhaust flow rate, and the resistance acting on the exhaust port.

The suppression required time t with respect to internal pressure fluctuation $\Delta P$ can be determined in this manner, as an example.

Figure 3:
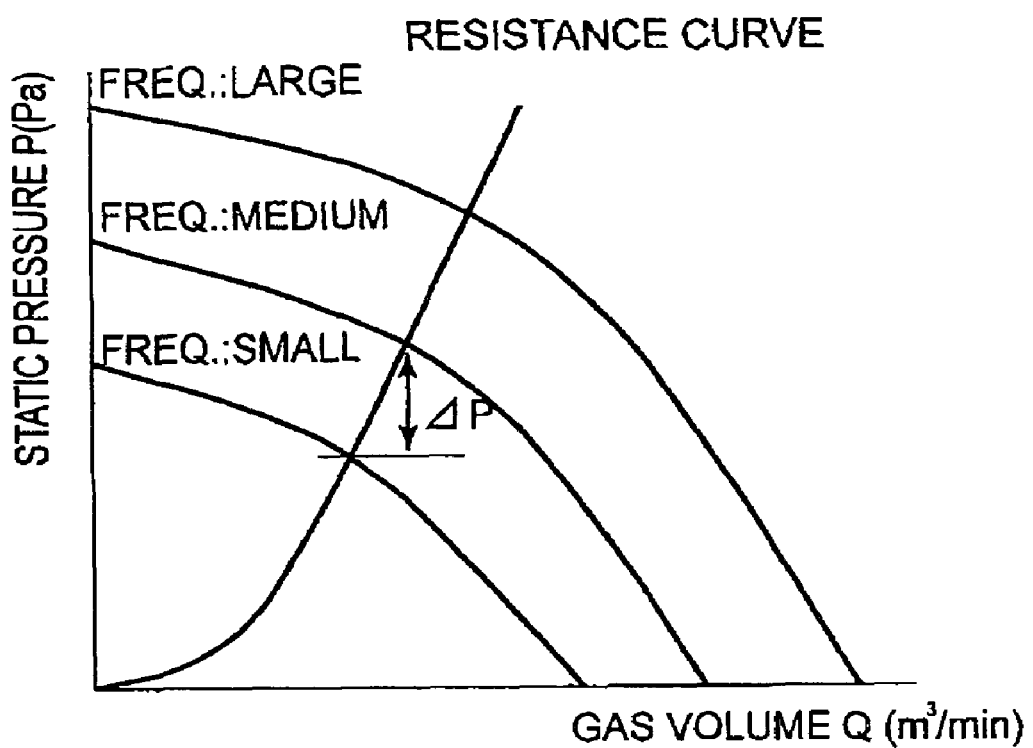
FIG. 3 is a graph, illustrating capacity curves of a blower and a resistance curve of the circulation system, in the embodiment of FIG. 1.

Furthermore, on the basis of the capacity curve of the blower as well as the resistance curve as determined by the pressure loss of the circulation system, the operation point at each rotational frequency is determined. Here, the largest rise in pressure (internal pressure fluctuation) $\Delta P$ where the rotational frequency is raised is determined. FIG. 3 illustrates this.

Figure 4:
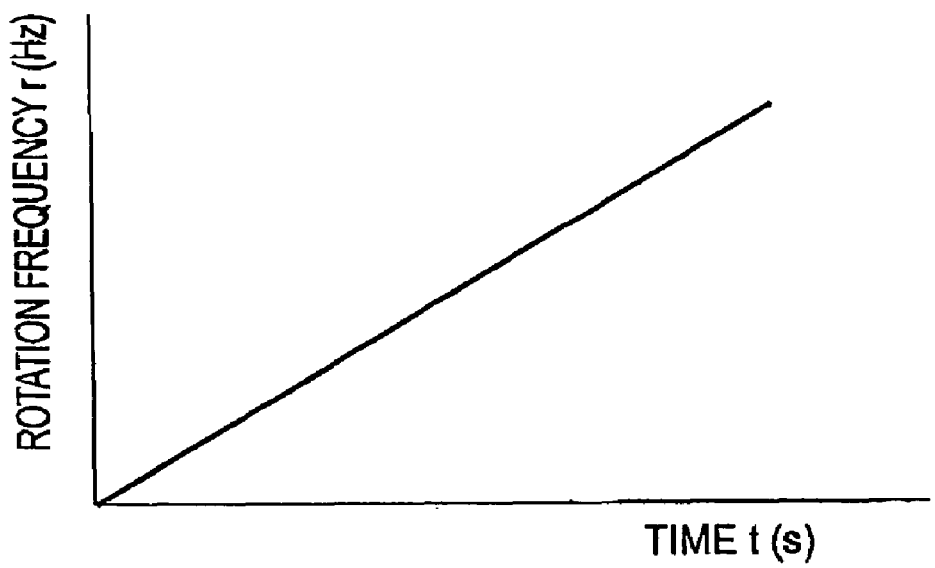
FIG. 4 is a graph for explaining a characteristic of a rotational frequency gradient controlling mechanism in the FIG. 1 embodiment.

More specifically, the largest rise in pressure $\Delta P$ to be produced by increasing the revolution speed of the blower is determined such as shown in FIG. 3. If the time for causing such a change in the rotational frequency is equal to or longer than the time t required for suppressing the internal pressure fluctuation as determined in FIG. 2, the internal pressure fluctuation can be suppressed to be within a tolerable range. Based on this, a rotational frequency gradient controlling characteristic effective to prevent an internal pressure fluctuation is determined. FIG. 4 illustrates an example of such a rotational frequency gradient controlling characteristic.

In this embodiment, a rotational frequency (revolutional speed) gradient controlling mechanism 18 for controlling the rotational frequency gradient of the circulation blower 10 is provided so as to perform the gradient control as determined in FIG. 4. By this, the transitional pressure fluctuation inside the gas-tight chamber can be suppressed to be within a tolerance. When the revolution speed is going to be lowered, similarly, by controlling the time period necessary for decreasing the revolution speed, the internal pressure fluctuation can be suppressed as well.

In accordance with this embodiment of the present invention, the balance between the pressure loss from the blower to the gas-tight chamber and the pressure loss from the gas-tight chamber to the blower is disrupted intentionally, by which a positive pressure can be held inside the circulation system. Additionally, the internal pressure fluctuation of the gas-tight chamber when the revolution speed of the blower is changed can be suppressed into a tolerable range. Furthermore, even upon a start and a stop of the blower operation, the internal pressure fluctuation can be suppressed into a withstanding-pressure range.

In this embodiment, the parameter (rotational frequency gradient) of the rotational frequency gradient controlling unit is determined in accordance with the time constant, which is determined by the capacity of the circulation system, the exhaust flow rate and the resistance to the exhaust port. However, as an alternative, a pressure gauge 21 may be used and, while monitoring the inside pressure of the gas-tight chamber by it, the revolution speed of the blower may be controlled so that the pressure fluctuation does not go out of the tolerance.

Second Embodiment

Figure 5:
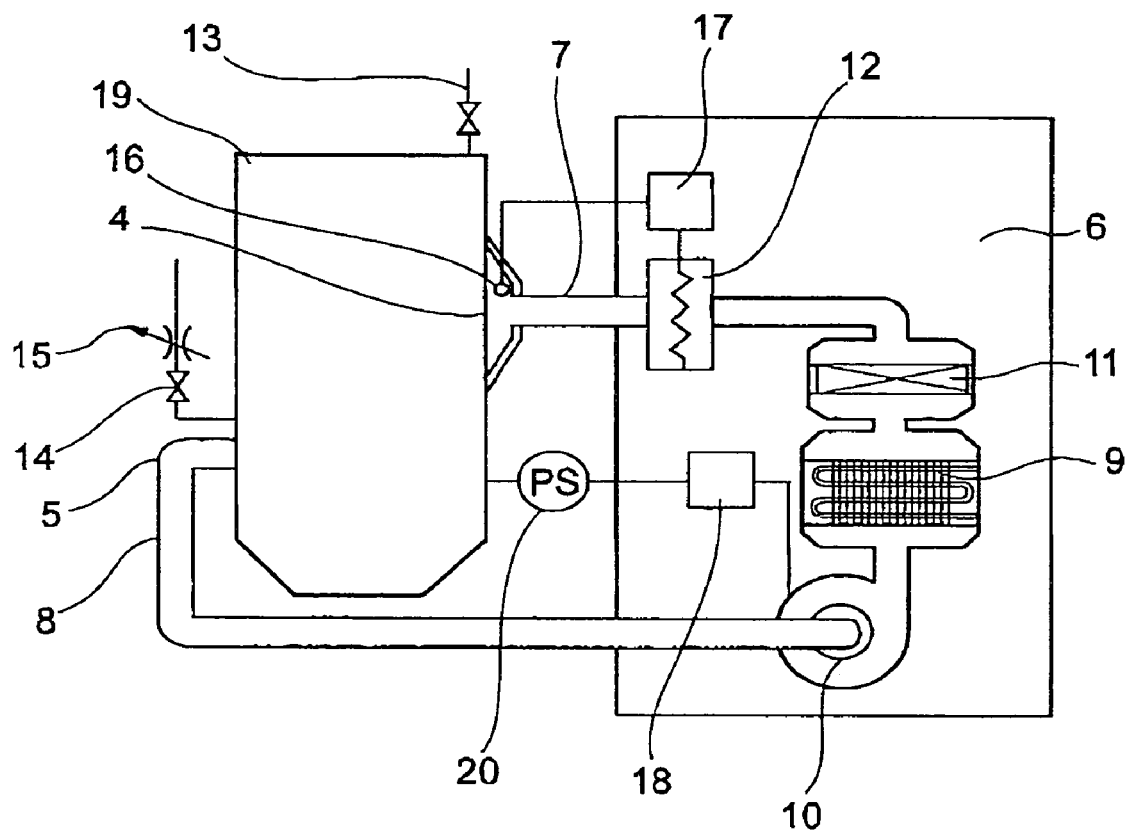
FIG. 5 is a schematic view of a general structure of an inactive gas circulation system inside a lens barrel, of an exposure apparatus according to a second embodiment of the present invention.
Figure 7:
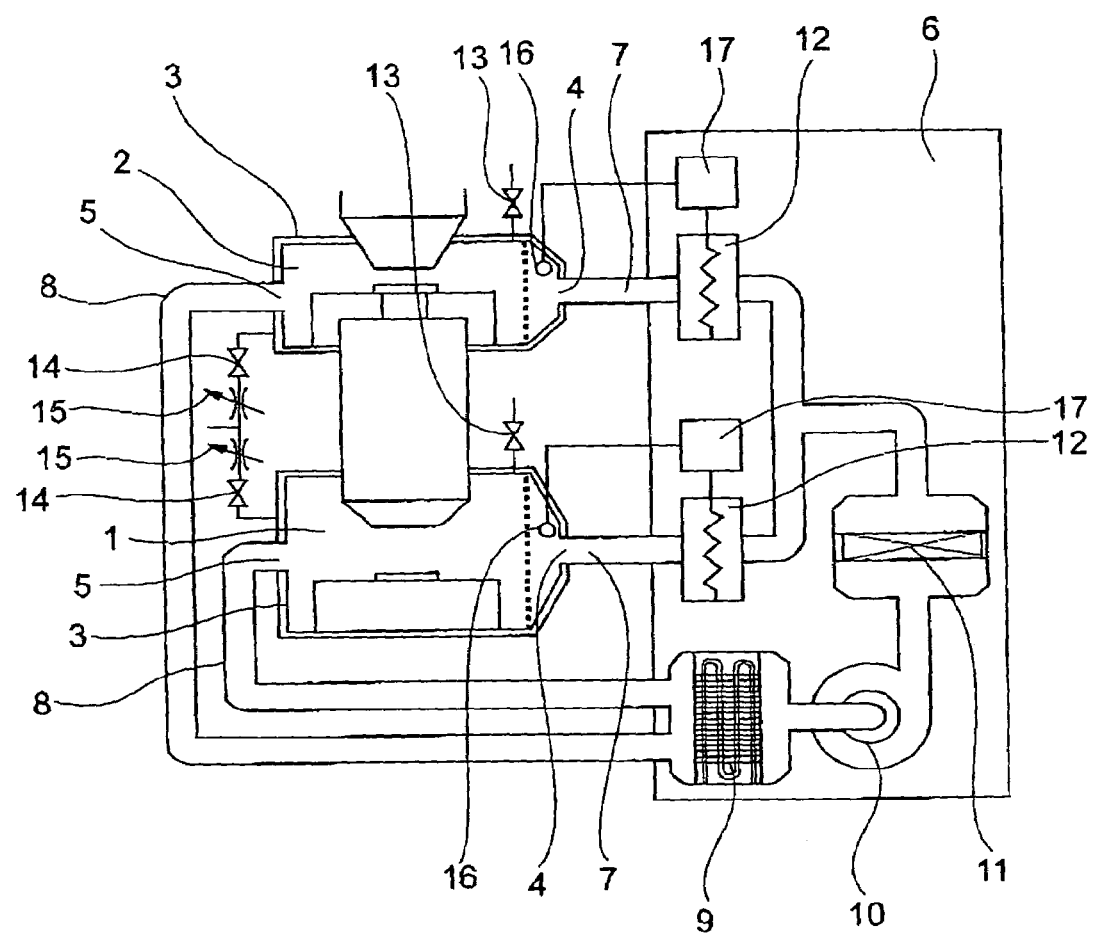
FIG. 7 is a schematic view of a general structure of a known type of inactive gas circulation system.

FIG. 5 is a schematic view of an exposure apparatus according to a second embodiment of the present invention. This embodiment is an example wherein the invention is applied to an inactive gas circulation system for purging, by use of an inactive gas, the inside of a lens barrel (or, alternatively, a chamber for enclosing at least a portion of an optical element) of an exposure apparatus. In FIG. 5, the elements corresponding to those shown in FIG. 1 or FIG. 7 are denoted by like reference numerals.

As shown in FIG. 5, the inside of a lens barrel 19 is a gas-tight space. The lens barrel 19 has a temperature-controlled gas blow-out port 4 and a gas collecting port 5. A circulating system 6 is provided to circulate an inactive gas through the lens barrel 19, the circulating gas being temperature controlled and contaminants removed. The circulating system 6 is connected to the blow-out port 4 through a gas supply duct 7, and to the gas collecting port 5 through a gas return duct 8. The circulating system 6 comprises a blower 10, a cooling device 9, a filter 11 and a heater 12, which are provided in this order along the inactive gas flow direction, as internal equipment.

In addition to this, a high-purity inactive gas (or inert gas) is injected into the lens barrel 19 from an inactive gas injection valve 13. This is to maintain the inactive gas concentration inside the lens barrel inner space. Furthermore, there is a discharging valve 14, which serves to discharge a predetermined amount of gas outwardly through a throttle valve 15. With this structure, a positive pressure is created and maintained inside the lens barrel inner space, such that entry of the atmospheric gas is well suppressed.

In the circulation system described above, a cooling device, which provides a pressure loss, is disposed between the blower and the lens barrel, to ensure that the pressure loss from the blower to the lens barrel becomes larger than the pressure loss from the lens barrel to the blower. With this arrangement, a positive pressure is held even at the blower suction pressure which becomes lowest inside the circulation system. By maintaining a positive pressure in the circulation system as such, entry of an atmospheric gas or of particles can be well suppressed.

Furthermore, in this embodiment, a rotational frequency (revolutional speed) gradient controlling mechanism is provided in relation to the circulation blower, so as to perform the gradient control as determined in FIGS. 2-4. By this, the transitional pressure fluctuation inside the lens barrel can be suppressed into a tolerance.

Namely, in accordance with this embodiment of the present invention, the balance between the pressure loss from the blower to the lens barrel and the pressure loss from the barrel to the blower is disrupted intentionally, and a rotational frequency gradient controlling mechanism is provided. With this arrangement, while keeping a positive pressure inside the circulation system, the pressure fluctuation inside the lens barrel, which might occur at a start and a stop of the blower operation, can be suppressed into a tolerable range (withstanding-pressure range).

In this embodiment, the parameter (rotational frequency gradient) of the rotational frequency gradient controlling unit is determined in accordance with the time constant, which is determined by the capacity of the circulation system, the exhaust flow rate and the resistance to the exhaust port. However, as an alternative, a pressure gauge 20 may be used and, while monitoring the inside pressure of the lens barrel by it, the revolution speed of the blower may be controlled so that the internal pressure fluctuation does not go out of the tolerance.

Third Embodiment

Next, an embodiment of a device manufacturing method, which uses an exposure apparatus described above, will be explained.

Figure 6:
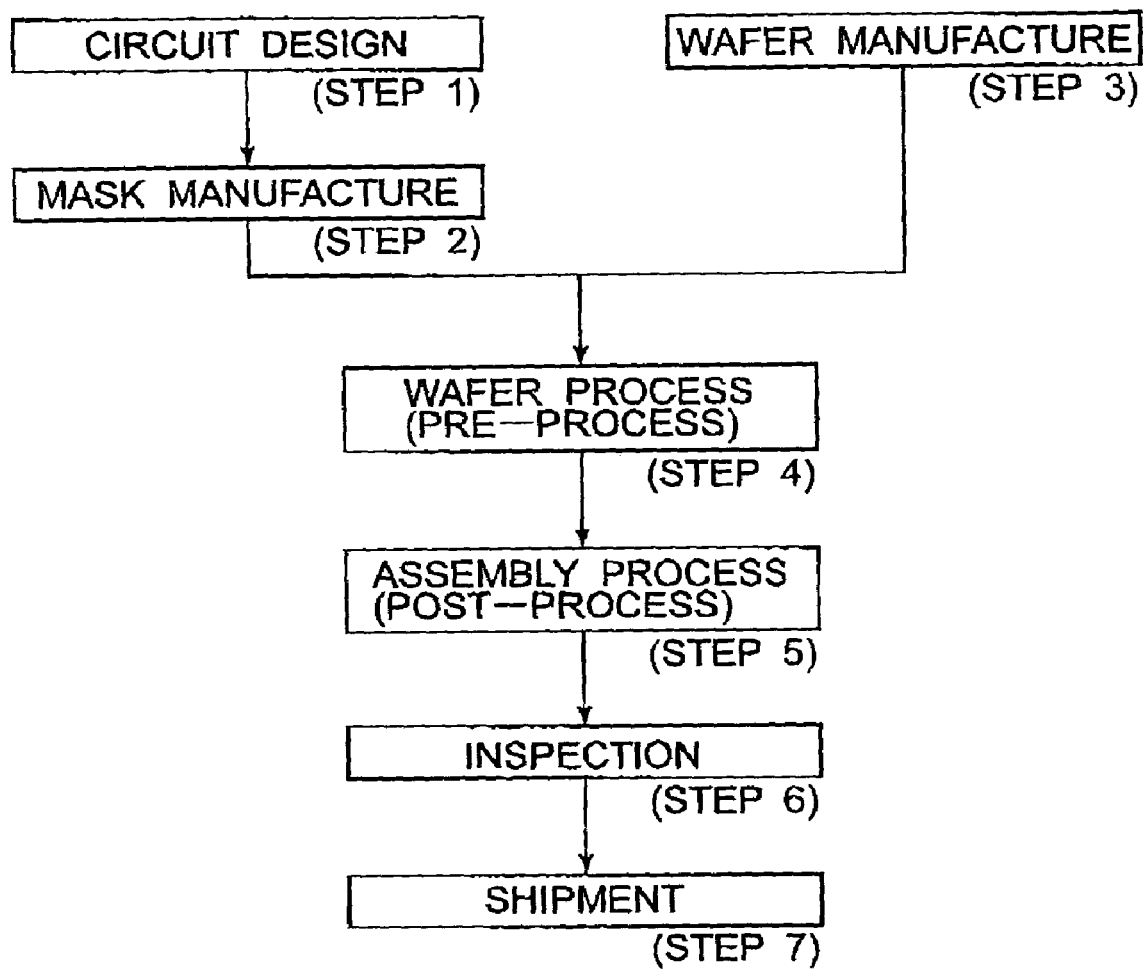
FIG. 6 is a flow chart of a device manufacturing process.

FIG. 6 is a flow chart for explaining the procedure of producing microdevices, such as semiconductor chips (e.g., ICs or LSIs), liquid crystal panels, CCDs, thin film magnetic heads, and micromachines, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process, which is called a pre-process, wherein, by using the thus prepared mask and wafer, a circuit is formed on the wafer in practice, in accordance with lithography. Step 5, subsequent to this, is an assembling step, which is called a post-process, wherein the wafer having been processed at step 4 is formed into semiconductor chips. This step includes an assembling (dicing and bonding) process and a packaging (chip sealing) process. Step 6 is an inspection step wherein an operation check, a durability check, and so on, for the semiconductor devices produced by step 5, are carried out. With these processes, semiconductor devices are produced, and they are shipped (step 7).

More specifically, the wafer process at step 4 described above includes (i) an oxidation process for oxidizing the surface of a wafer, (ii) a CVD process for forming an insulating film on the wafer surface, (iii) an electrode forming process for forming electrodes upon the wafer by vapor deposition, (iv) an ion implanting process for implanting ions to the wafer, (v) a resist process for applying a resist (photosensitive material) to the wafer, (vi) an exposure process for printing, by exposure, the circuit pattern of the mask on the wafer through the exposure apparatus described above, (vii) a developing process for developing the exposed wafer, (viii) an etching process for removing portions other than the developed resist image, and (ix) a resist separation process for separating the resist material remaining on the wafer after being subjected to the etching process.

By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

This application claims priority from Japanese Patent Application No. 2004-271727 filed Sep. 17, 2004, which is hereby incorporated by reference herein.

What is claimed is:

1. An apparatus for exposing a wafer with light, said apparatus comprising:

a chamber for enclosing at least a portion of a path of the light;

a circulation system having a fan unit, an inactive gas supplying path from said fan unit to said chamber, and an inactive gas return path from said chamber to said fan unit, said circulation system being arranged to circulate an inactive gas through said chamber; and a control unit for controlling said fan unit, said control unit changing a revolution speed of said fan unit so that the gas pressure inside said chamber is held within a tolerance, wherein a pressure loss at the return path is less than a positive pressure being set with respect to a gas pressure inside the chamber.

2. An apparatus according to claim 1, wherein said control unit changes the revolution speed of said fan unit on the basis of a time constant in a decay process of gas pressure fluctuation inside said chamber.

3. An apparatus according to claim 1, further comprising a pressure gauge for measuring the gas pressure inside said chamber, wherein said control unit changes the revolution speed of said fan unit on the basis of an output of said pressure gauge, so that the gas pressure inside said chamber is held within the tolerance.

4. An apparatus according to claim 1, wherein said chamber encloses at least one of (i) a space in which a reticle is to be disposed, (ii) a space in which a wafer is to be disposed, and (iii) at least a portion of an optical element provided to direct the light.

5. A device manufacturing method, comprising steps of:
exposing a substrate with light by use of an apparatus as recited in claim 1;
developing the exposed substrate; and
processing the developed substrate to produce a device.

* * * * *